United States Patent [19]
Gill

[11] Patent Number: 6,097,579
[45] Date of Patent: Aug. 1, 2000

[54] TUNNEL JUNCTION HEAD STRUCTURE WITHOUT CURRENT SHUNTING

[75] Inventor: Hardayal Singh Gill, Portola Valley, Calif.

[73] Assignee: International Business Machines Corporation, Armonk, N.Y.

[21] Appl. No.: 09/137,996

[22] Filed: Aug. 21, 1998

[51] Int. Cl.[7] .................................................. G11B 5/127
[52] U.S. Cl. ........................................................ 360/324.2
[58] Field of Search ..................................... 360/113, 126; 324/252

[56] References Cited

U.S. PATENT DOCUMENTS

| | | | |
|---|---|---|---|
| 5,018,037 | 5/1991 | Krounbi et al. | 360/113 |
| 5,159,513 | 10/1992 | Dieny et al. | 360/113 |
| 5,206,590 | 4/1993 | Dieny et al. | 324/252 |
| 5,373,238 | 12/1994 | McGuire et al. | 324/252 |
| 5,650,958 | 7/1997 | Gallagher et al. | 365/173 |
| 5,729,410 | 3/1998 | Fontana, Jr. et al. | 360/113 |
| 5,955,211 | 9/1999 | Maeda et al. | 360/113 |

FOREIGN PATENT DOCUMENTS 9092908  4/1997  Japan .

Primary Examiner—Allen T. Cao
Attorney, Agent, or Firm—William D. Gill

[57] ABSTRACT

A magnetic tunnel junction (MTJ) device for use as a magnetic field sensor or as a memory cell in a magnetic random access (MRAM) array has one pinned ferromagnetic layer and one free ferromagnetic layer formed on opposite sides of an insulating tunnel barrier layer, and a hard biasing layer that is in proximate contact with and magnetostatically coupled to the free ferromagnetic layer. The magnetic tunnel junction in the sensor is formed on a first shield, which also serves as an electrical lead, and is made up of a stack of layers (MTJ stack). The layers in the MTJ stack are an antiferromagnetic layer, a pinned ferromagnetic layer, an insulating tunnel barrier layer, and a free ferromagnetic layer. The MTJ stack is generally rectangularly shaped with parallel side edges. A layer of hard biasing ferromagnetic material is in abutting contact to or overlapping the MTJ stack to longitudinally bias the magnetic moment of the free ferromagnetic layer in a preferred direction. A first layer of electrically insulating material isolates the hard biasing material from the first shield so that sensing current is not shunted to the hard biasing material but is allowed to flow perpendicularly through the layers in the MTJ stack. A second layer of electrically insulating material isolates the hard bias material from the second shield which also acts as an electrical lead for the MTJ stack.

20 Claims, 6 Drawing Sheets

TUNNEL JUNCTION HEAD STRUCTURE WITHOUT CURRENT SHUNTING

BACKGROUND OF THE INVENTION

1. Field of the Invention

This invention relates in general to magnetic tunnel junction transducers for reading information signals from a magnetic medium and, in particular, to a magnetic tunnel junction sensor without current shunting, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

The use of an MTJ sensor as an MR read head requires a structure that generates an output signal that is both stable and linear with respect to the magnetic field strength from the recorded data on the disk. If some means is not used to maintain the ferromagnetic free layer of the MTJ sensor in a single magnetic domain state, the domain walls of magnetic domains will shift positions within the ferromagnetic free layer, causing noise which reduces the signal-to-noise ratio and which may give rise to an irreproducible response of the sensor. The problem of maintaining a single domain state is especially difficult in the case of an MTJ sensor because, unlike an GMR sensor, the sense current passes perpendicularly through the ferromagnetic layers and the tunnel barrier layer, and thus any metallic materials in contact with the edges of the ferromagnetic layers to produce a longitudinal magnetic bias field may provide a path for shunting the sensing current around the active region of the MTJ sensor resulting in reduced sensitivity.

An MTJ sensor having longitudinal biasing is disclosed in IBM's U.S. Pat. No. 5,729,410 ('410) granted to Fontana et al., and is incorporated in its entirety herein by reference. In the '410 patent, the biasing ferromagnetic layer is separated and electrically isolated from the edges of the MTJ sensor layers by an insulating layer having a thickness sufficient to electrically isolate the biasing layer from the MTJ sensor and the electrical leads but thin enough to permit magnetostatic coupling with the free layer. An insulating layer thickness in the range of 250–400 Å separating the biasing layer from the MTJ sensor layer edges is needed to provide the required electrical isolation. This relatively large separation of the layers is a problem since the degree of magnetostatic coupling between the ferromagnetic biasing layer and the free layer decreases rapidly with increased separation of the layers especially when the separation of the layers becomes greater than the thickness of the layers. MTJ sensors having free layer thicknesses in the range of 20–50 Å are needed to meet future requirements for high density magnetic storage. Separation of the ferromagnetic biasing layer from the free layer by more than five times the layer thicknesses will result in weak magnetostatic coupling resulting in decreased stability and reduced signal-to-noise of the MTJ sensor. In addition, the high sensitivity of magnetostatic coupling to the separation of the bias layer from the free layer will cause difficulty in controlling the degree of magnetostatic coupling, and therefore the hard bias properties during manufacturing.

What is needed is an MTJ sensor structure that provides the longitudinal magnetic biasing field required to provide a stable and linear response to the magnetic signal fields by reducing the separation of the ferromagnetic biasing layer from the free layer to values less than or in the range of the ferromagnetic layer thicknesses without providing a path for sensing current shunting around the active region of the MTJ sensor.

SUMMARY OF THE INVENTION

It is an object of the present invention to disclose an improved magnetoresistive tunnel junction (MTJ) sensor with electrically insulating layers separating the electrical leads from a hard bias layer to prevent shunting of sense current around the MTJ sensor active region.

It is another object of the present invention to disclose an MTJ sensor structure having reduced separation of the hard bias layer from the free layer to improve the magnetostatic coupling of the hard bias layer to the free layer.

It is a further object of the present invention to disclose an MTJ sensor structure using the ferromagnetic shield layers as the electrical leads to supply the sense current flowing perpendicularly to the sensor plane.

In accordance with the principles of the present invention, there is disclosed an MTJ sensor having end regions separated from each other by a central region, the MTJ sensor having direct electrical contact in the central region area between the first shield and the first electrode of the MTJ sensor and between the second electrode of the MTJ sensor and the second shield. The end regions adjacent and contiguous to the active central region of the MTJ sensor have conducting ferromagnetic hard bias layers which are electrically insulated from the first and second shields so that the sensing current only flows through the active central region of the MTJ sensor and is not shunted by the end regions.

The MTJ sensor structure comprising a seed layer, an AFM layer, a pinned ferromagnetic layer, a tunnel barrier layer, a free ferromagnetic layer, and a cap layer are sequentially deposited on the first shield. The active central region of the MTJ sensor (MTJ stack) is then defined by photolithography on a photoresist material and the non-active regions of the sensor layers are removed by ion beam etching. A first electrically insulating layer of material having a thickness approximately equal to the thickness of the MTJ stack is deposited on the end regions of the first shield. The magnetic domain stabilizing layers of ferromagnetic material are then deposited over the first electrically insulating layer forming hard bias layers to provide a longitudinal bias field magnetostatically coupled to the free layer in the central region. A second electrically insulating layer is then deposited over the hard bias layers. The photoresist covering the active central region of the MTJ sensor is then removed and the second shield of ferromagnetic material is deposited over the entire MTJ sensor area making direct electrical contact with the second electrode of the MTJ sensor in the active central region.

In the MTJ sensor structure of the present invention, the ferromagnetic first and second shield layers provide magnetic shielding from stray magnetic fields as is known to the art and also provide the electrical leads to supply sensing current to the first and second electrodes, respectively, of the MTJ stack. The first insulation layer in the end regions provides electrical isolation between the first shield and the hard bias layers deposited on the first insulation layer. The first insulation layer also provides electrical isolation between the first and second electrodes of the MTJ stack preventing shunting of sensing current flow around the tunnel barrier layer through the end regions. The structure of this invention allows the hard bias layers to be deposited in contact with the top layer of the second electrode of the MTJ stack thus improving the magnetostatic coupling between the hard bias layer and the free layer to improve stabilization of the magnetic domain state of the free layer. The second insulator layer provides electrical isolation of the hard bias layers from the second shield to further reduce the possibility of electrical shorting between the first and second shields.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
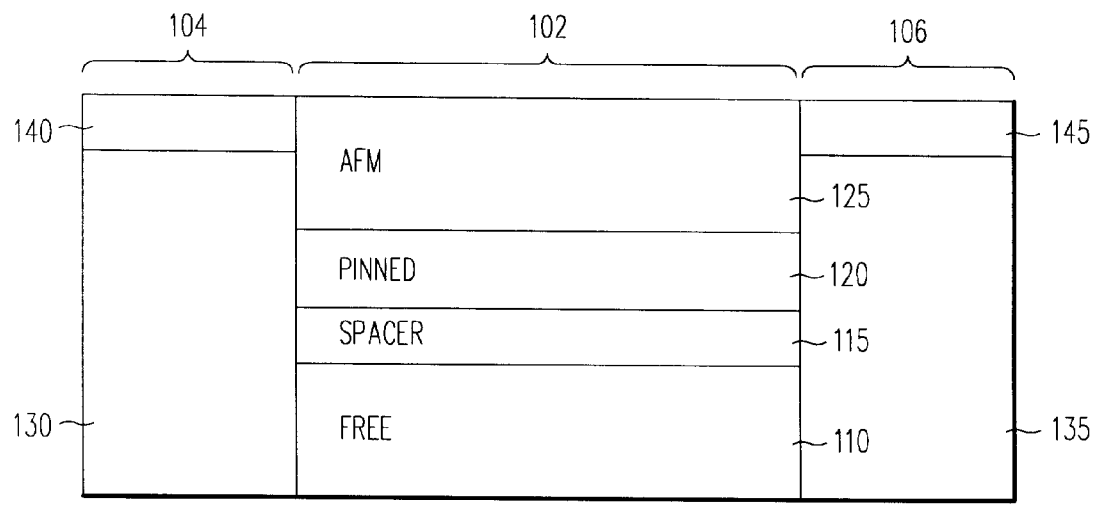
FIG. 1 is an air bearing surface view, not to scale, of a prior art SV sensor.
Figure 3A:
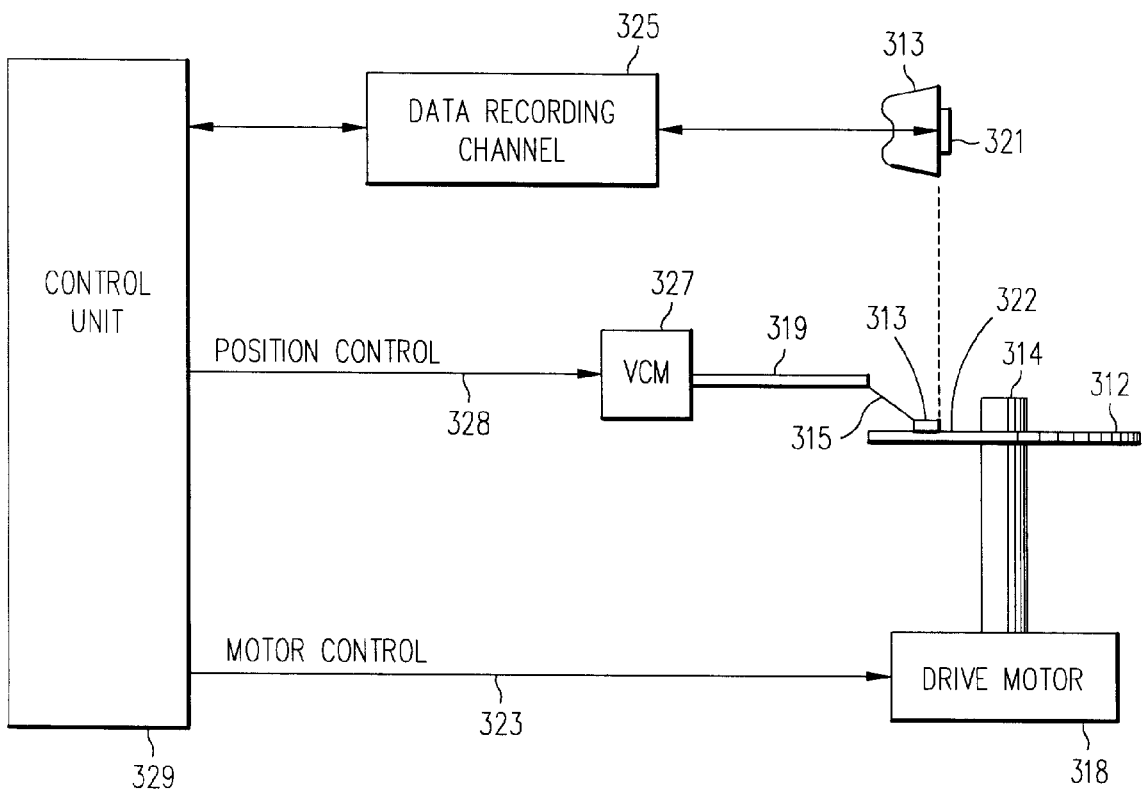
FIG. 3a is a simplified drawing of a magnetic recording disk drive system.
Figure 2:
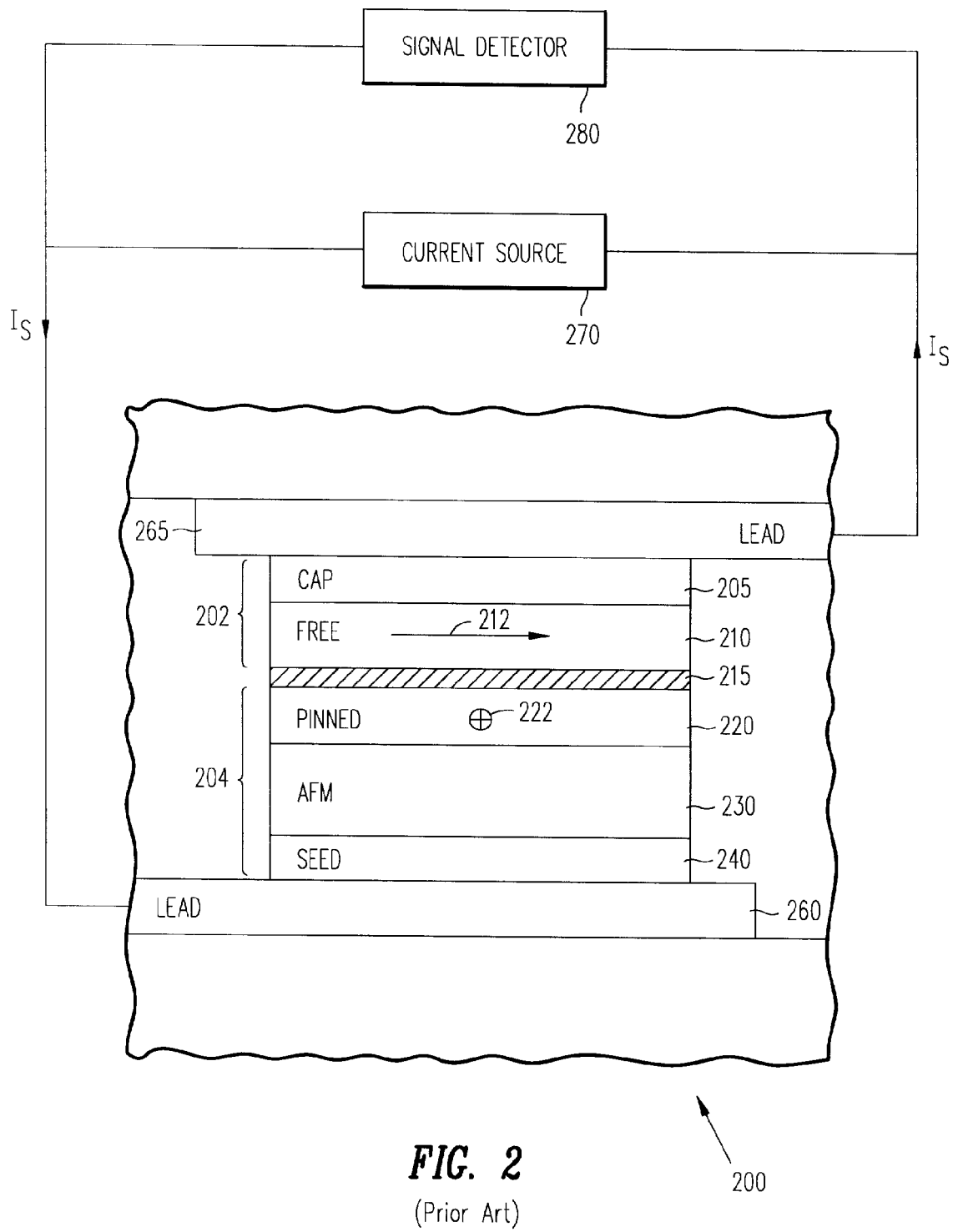
FIG. 2 is an air bearing surface view, not to scale, of a prior art magnetic tunnel junction sensor.

Referring now to FIG. 3a, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the MTJ sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counterbalances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325.

The above description of a typical magnetic disk storage system, and the accompanying illustration of FIG. 3a are for representation purposes only. It should be apparent that disk storage systems may contain a large number of disks and actuators, and each actuator may support a number of sliders.

Figure 3B:
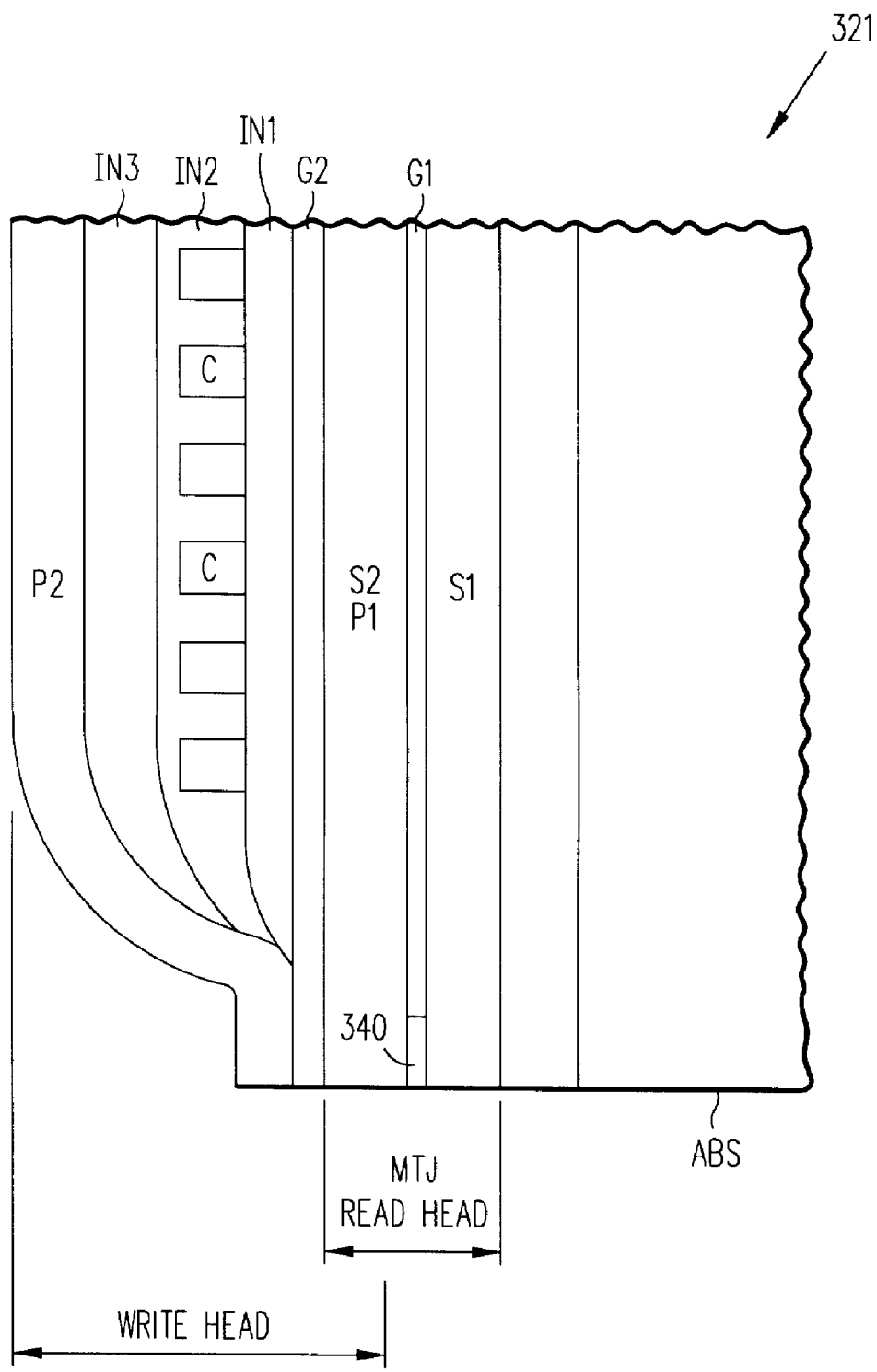
FIG. 3b is a vertical cross-section view (not to scale) of an inductive write/MTJ read head with the MTJ read head located between shields and adjacent to the inductive write head.

FIG. 3b shows a cross-sectional schematic view of the read/write head 321 embodying the present invention which includes an MTJ read head portion and an inductive write head portion. The head 321 is lapped to form an ABS. The read head includes an MTJ sensor 340 disposed between first and second shield layers S1 and S2. An insulating gap layer G1 is disposed between the first and second shield layers S1 and S2 in the region away from the MTJ sensor. The write head includes a coil layer C and an insulation layer IN2 which are disposed between insulation layers IN1 and IN3 which are, in turn, disposed between first and second pole pieces P1 and P2. A gap layer G2 is disposed between the first and second pole pieces P1, P2 for providing a magnetic gap at their pole tips adjacent to the ABS for providing a write gap. The combined read/write head 321 shown in FIG. 3b is a "merged" head in which the second shield layer S2 of the read head is employed as a first pole piece P1 for the write head.

Figure 4:
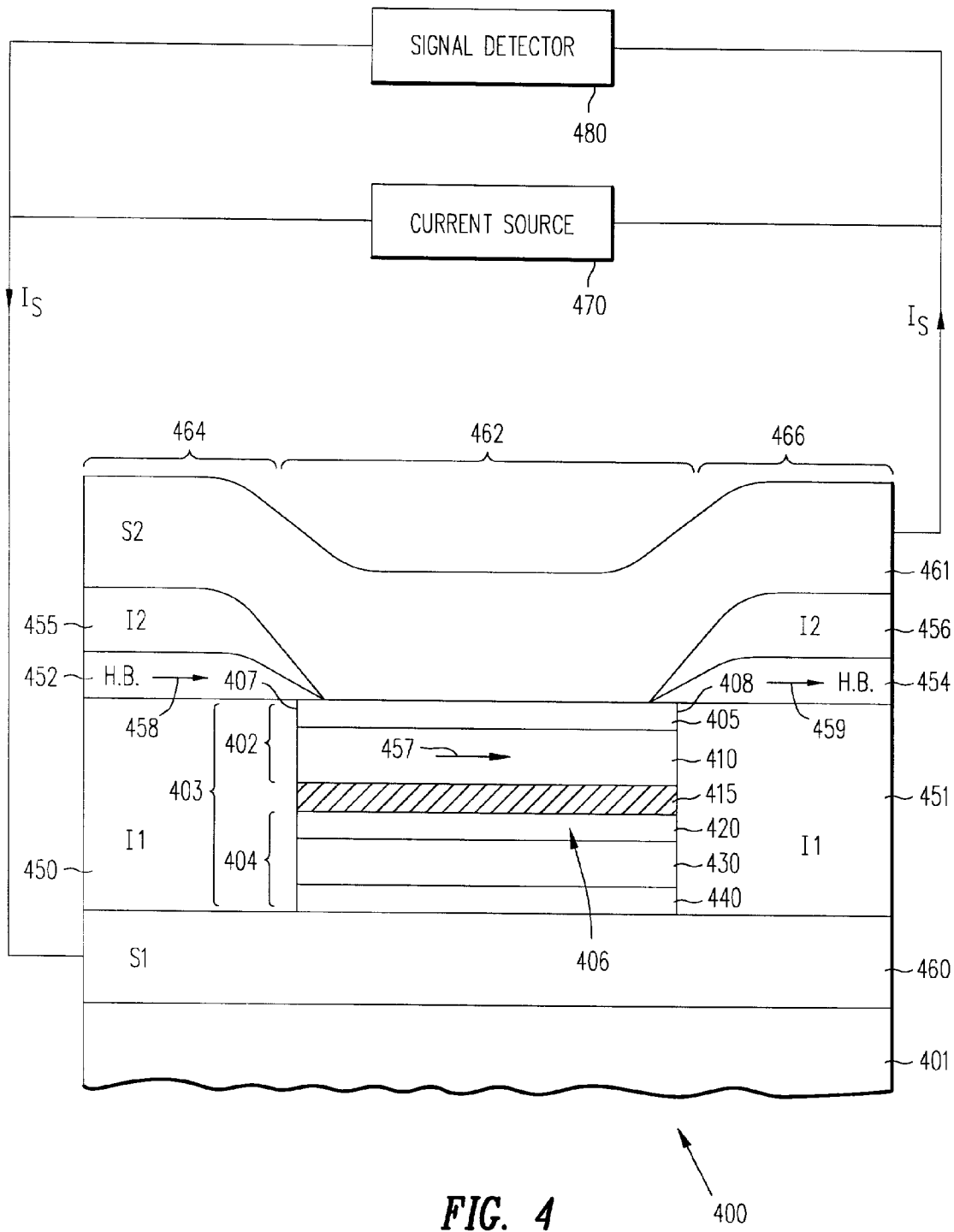
FIG. 4 is an air bearing surface view, not to scale, of an embodiment of the magnetic tunnel junction sensor of the present invention.

FIG. 4 shows an air bearing surface (ABS) view of an MTJ sensor 400 according to the preferred embodiment of the present invention. The MTJ sensor 400 comprises end regions 464 and 466 separated from each other by a central region 462. The active region of the MTJ sensor 400 is an MTJ stack 403 formed in the central region 462. The MTJ stack 403 has a generally rectangular shape with a front edge 406 at the ABS, a back edge (not shown) opposite to the front edge 406, and two opposite side edges 407 and 408. The MTJ stack 403 comprises a first electrode 404, a second electrode 402 and a tunnel barrier layer 415 disposed between the first electrode 404 and the second electrode 402. The first electrode 404 comprises a pinned layer 420, an AFM layer 430, and a seed layer 440, where the pinned layer 420 is disposed between the tunnel barrier layer 415 and the AFM layer 430 and the AFM layer 430 is disposed between the pinned layer 420 and the seed layer 440. The second electrode 402 comprises a free layer 410 and a cap layer 405, where the free layer 410 is disposed between the tunnel barrier layer 415 and the cap layer 405.

The AFM layer 430 is exchange coupled to the pinned layer 420 providing an exchange field to pin the magnetization direction of the pinned layer 420 perpendicular to the ABS. The magnetization of the free layer 410 is oriented parallel to the ABS and is free to rotate in the presence of a signal magnetic field.

In the preferred embodiment of the present invention, the MTJ stack 403 is formed directly on first shield (S1) 460 in the central region 462. The first shield 460 is a layer of soft ferromagnetic material such as Ni—Fe (permalloy), or alternatively Al—Fe—Si (Sendust), deposited on a substrate 401 and extending over the central region 462 and the end regions 464 and 466 to provide magnetic shielding of the MTJ sensor from stray magnetic fields. First insulator (I1) layers 450 and 451 of electrically insulating material such as $Al_2O_3$ are formed in end regions 464 and 466, respectively, on the first shield 460 and in abutting contact to the side edges 407, 408 of the MTJ stack 403. Hard bias layers 452 and 454 of high coercivity ferromagnetic material, such as preferably a Co—Pt—Cr alloy, are formed on the first insulator layers 450 and 451, respectively. Second insulator (I2) layers 455 and 456 of electrically insulating material such as $Al_2O_3$ are formed on the hard bias layers 452 and 454, respectively. A second shield (S2) 461 of soft ferromagnetic material such as Ni—Fe, or alternatively Al—Fe—Si, is formed over the second insulator layers 455 and 456 in the end regions 464 and 466, respectively, and over the MTJ stack 403 in the central region 462.

The first shield (S1) 460 provides electrical connection to the first electrode 404 of the MTJ stack 403 since the seed layer 440 of electrically conductive material is deposited on and in contact with the first shield layer 460. The second shield (S2) 461 provides electrical connection to the second electrode 402 of the MTJ stack 403 in the central region 462 since the second shield 461 is deposited on and in contact with the cap layer 405 of electrically conductive material. The first and second shields 460 and 461 provide electrical connections for the flow of the sensing current $I_s$ from a current source 470 to the MTJ stack 403. In the MTJ stack 403, the flow of the sensing current $I_s$ is in a direction perpendicular to the plane of the tunnel barrier layer 415. A signal detector 480 which is electrically connected to shields 460 and 461 senses the change in the resistance due to changes induced in the free layer 410 by the external magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a PRML channel as is known to those skilled in the art. The signal detector 480 also includes other supporting circuitries such as a preamplifier (electrically placed between the sensor and the channel) for conditioning the sensed resistance changes as is known to those skilled in the art.

The hard bias layers 452 and 454 in the end regions 464 and 466, respectively, have magnetization directions parallel to the ABS as shown by arrows 458 and 459. The hard bias layers 452 and 454 provide longitudinal bias to the free layer 410 to ensure that the free layer magnetization forms a stable single domain configuration with orientation parallel to the ABS as shown by the arrow 457. The separation of the free layer 410 from the hard bias layers 452 and 454 formed in abutting contact to or overlapping the cap layer 405 is approximately equal to the thickness of the cap layer 405. This small separation (less than 50 Å) provides good magnetostatic coupling of the hard bias layers 452, 454 to the free layer 410 to ensure effectiveness of the longitudinal bias.

The first insulator layers (I1) 450, 451 disposed between the first shield 460 and the hard bias layers 452 and 454 and having thickness approximately equal to the thickness of the MTJ stack 403 provide electrical insulation preventing sensing current flow through the end regions 464, 466 from shunting the MTJ stack 403. The second insulator layers (I2) 455, 456 disposed between the hard bias layers 452 and 454 and the second shield 461 provide added electrical insulation to prevent shorting between the first and second shields 460 and 461 in the end regions 464, 466.

Figure 5A:
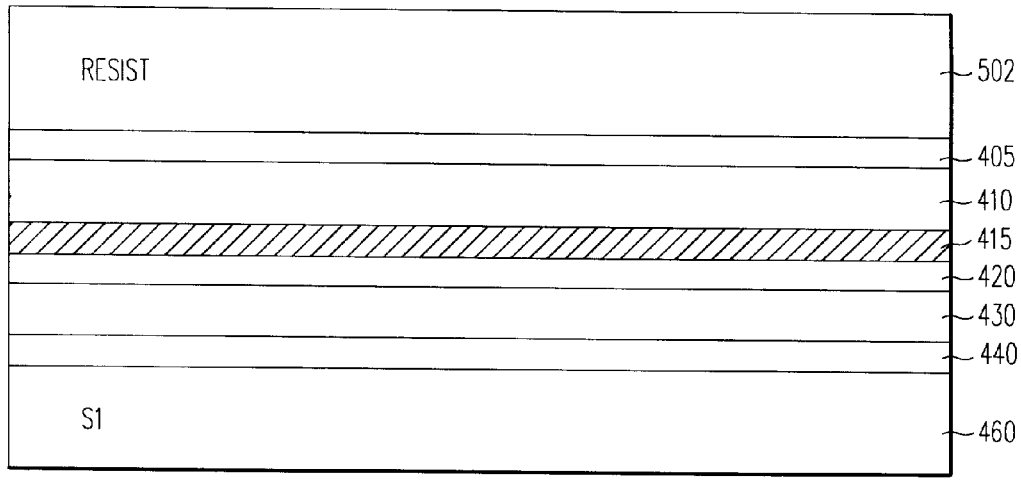
FIGS. 5a–5c are air bearing surface views, not to scale, illustrating the fabrication of the magnetic tunnel junction sensor of the present invention.
Figure 5B:
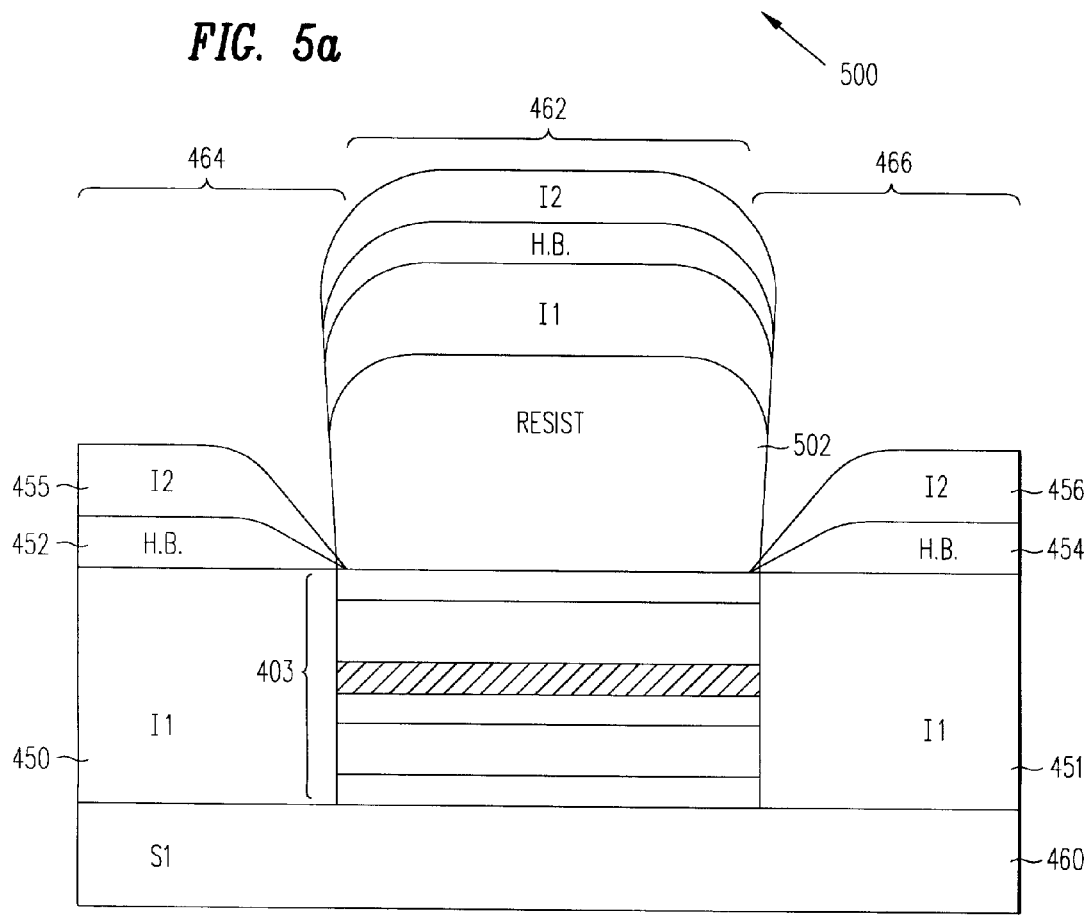
Figure 5C:
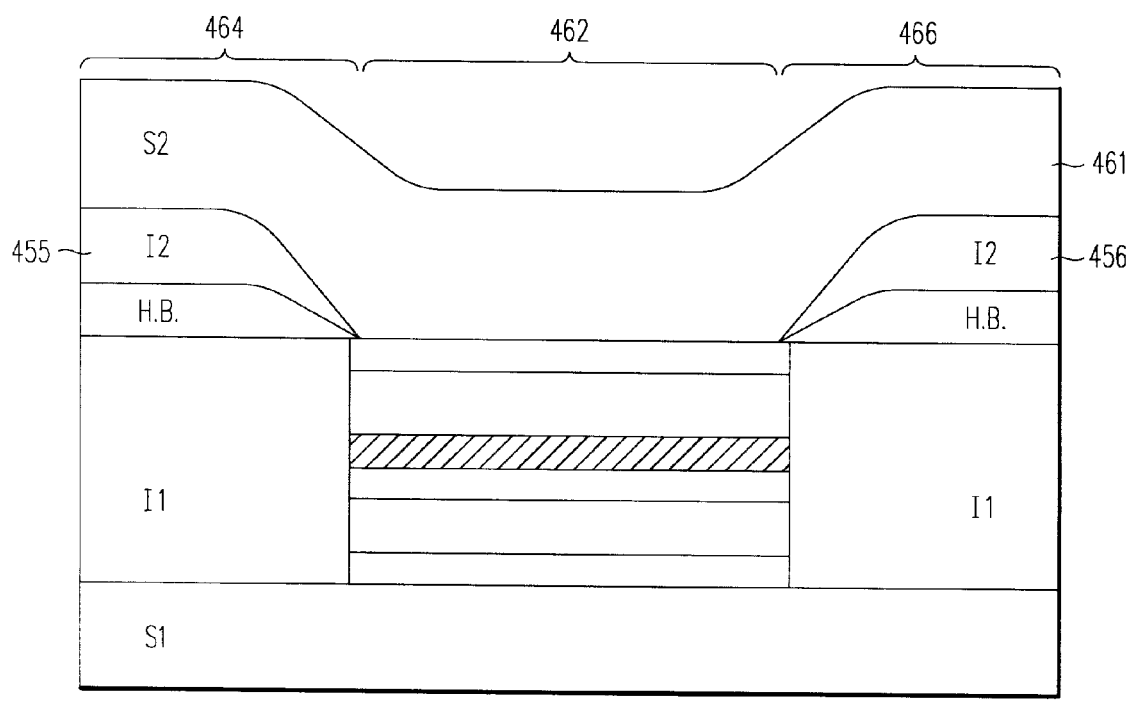

Referring now to FIGS. 5a, 5b and 5c, the method of making the preferred embodiment of the present invention of the MTJ sensor 500 is shown. The MTJ sensor can be fabricated in a magnetron sputtering or an ion beam sputtering system to sequentially deposit the multilayer structure shown in FIG. 5a on the first shield (S1) 460. The seed layer 440, the AFM layer 430, the pinned layer 420, the tunnel barrier layer 415, the free layer 410, and the cap layer 405 are sequentially deposited over the first shield 460 in the presence of a longitudinal or transverse magnetic field of about 40 Oe to orient the easy axis of all of the ferromagnetic layers. The seed layer 440 is a sub-layer layer formed of Ta having a thickness of about 30–50 Å and a ferromagnetic layer of Ni—Fe having a thickness of about 40 Å to encourage the growth of the AFM layer 430. The AFM layer 430 formed of $Mn_{50}$—$Fe_{50}$ having a thickness of about 100 Å is deposited on the seed layer 440. The ferromagnetic pinned layer 420 may be formed of Ni—Fe having a thickness in the range of about 20–50 Å, or alternatively, may be formed of a sub-layer of Ni—Fe having a thickness in the range of 20–50 Å deposited on the AFM layer 430 and an interface layer of Co having a thickness of about 5 Å deposited on the Ni—Fe sublayer. The tunnel barrier layer 415 is formed of $Al_2O_3$ by depositing and then plasma oxidizing an 8–20 Å aluminum (Al) layer on the pinned layer 420. The ferromagnetic free layer 410 may be formed of Ni—Fe having a thickness in the range of 20–50 Å, or alternatively, may be formed of an interface layer of Co having a thickness of about 5 Å deposited on the tunnel barrier layer 415 and a sub-layer of Ni—Fe having a thickness in the range of 20–50 Å deposited on the Co interface layer. The cap layer 405 formed of Ta having a thickness in the range of 20–50 Å is deposited on the free layer 410.

Photoresist layer 502 is formed over the cap layer 405. An intermediate layer of polydimethylglutarimide (PMGI) may be formed between the photoresist layer 502 and the cap layer 405 in order to facilitate the liftoff process when removing the photoresist 502. The MTJ stack 403 is then defined by photolithography as is well established in the art.

FIG. 5b shows the MTJ sensor 500 after the photolithography step defining the central region 462. The photoresist masks the active region of the MTJ sensor during ion beam milling to remove the portions of the AFM layer 430, the pinned layer 420, the tunnel barrier layer 415, the free layer 410 and the cap layer 405 in the end regions 464, 466 not protected by the photoresist. The insulator and hard bias layer structures can now be deposited in the end regions 464, 466. The first insulator layers (I1) 450 and 451 are formed of $Al_2O_3$ by depositing and then plasma oxidizing an aluminum (Al) layer having a thickness approximately equal to the total thickness of the MTJ sensor stack 403. The hard bias layers 452, 454 preferably formed of a Co—Pt—Cr alloy having a thickness in the range of about 40–100 Å are deposited on the first insulator layers 450 and 451, respectively. The second insulator layers (I2) 455 and 456 are formed of $Al_2O_3$ by depositing and then plasma oxidizing an aluminum (Al) layer having a thickness in the range of about 100–200 Å on the hard bias layers 452 and 454, respectively. The photoresist layer 502 protecting the central region 462 can now be removed by liftoff processes known to the art to expose the multilayer structure of the active region of MTJ sensor 500.

FIG. 5c shows the MTJ sensor 500 after liftoff of the resist layer 502 in the central region 462 and deposition of the second shield (S2) 461 on the central region 462 and the end regions 464, 466. The second shield 461 of Ni—Fe (permalloy) having a thickness in the range of about 5000–10000 Å makes direct electrical contact with the second electrode 402 of the MTJ stack 403. This completes the deposition process for fabrication of MTJ sensor 500.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A magnetic tunnel junction (MTJ) sensor, comprising:
a substrate;
a first shield (S1) of ferromagnetic material formed on the substrate;
a magnetic tunnel junction (MTJ) stack formed on said first shield, the MTJ stack having a generally rectangular shape and two opposite side edges, said MTJ stack comprising:
an antiferromagnetic (AFM) layer;
a pinned layer of ferromagnetic material in contact with said AFM layer;
a free layer of ferromagnetic material; and
a tunnel junction layer of electrically insulating material disposed between said pinned layer and said free layer;
a second shield (S2) of ferromagnetic material formed on and in contact with said MTJ stack;
a first insulator layer formed on the first shield layer on opposite sides of said MTJ stack and in abutting contact to the side edges of said MTJ stack;
a hard bias layer of ferromagnetic material formed on the first insulator layer on opposite sides of said MTJ stack and in abutting contact to or overlapping said MTJ stack, said hard bias layer having a magnetic moment for biasing the magnetic moment of the free layer in substantially the same direction as the moment of the hard bias layer in the absence of an applied magnetic field; and
a second insulator layer formed on the hard bias layer and separating said hard bias layer from said second shield layer.

2. The MTJ sensor as recited in claim 1, wherein the thickness of said first insulator layer is substantially equal to the thickness of said MTJ stack.

3. The MTJ sensor as recited in claim 1, wherein said first insulator layer is made of $Al_2O_3$.

4. The MTJ sensor as recited in claim 1, wherein said second insulator layer is made of $Al_2O_3$.

5. The MTJ sensor as recited in claim 1, further comprising:
a first electrical connection fixed on said first shield for making electrical contact from said first shield to a current source and to a signal detector; and
a second electrical connection fixed on said second shield for making electrical contact from said second shield to said current source and to said signal detector; said first and second shields providing electrical leads for sensing the electrical resistance to sense current flow perpendicularly through the MTJ stack and sense current flow is prevented by said first insulator layer from shunting around said MTJ stack.

6. The MTJ sensor as recited in claim 1, wherein said hard bias layer is made of Co—Pt—Cr.

7. The MTJ sensor as recited in claim 1, wherein said AFM layer is made of $Mn_{50}$—$Fe_{50}$.

8. The MTJ sensor as recited in claim 1, wherein said AFM layer is chosen from a group of materials including Mn—Fe, Ni—Mn, Pd—Mn, Pt—Mn, Pd—Pt—Mn, Ir—Mn, Rh—Mn, and Cr—Mn—Pt.

9. The MTJ sensor as recited in claim 1, wherein said first shield is made from Ni—Fe.

10. The MTJ sensor as recited in claim 1, wherein said second shield is made from Ni—Fe.

11. A disk drive system comprising:
a magnetic recording disk;
a magnetic tunnel junction (MTJ) sensor for sensing magnetically recorded data on said magnetic recording disk, said MTJ sensor comprising:
a substrate;
a first shield (S1) of ferromagnetic material formed on the substrate;
a magnetic tunnel junction (MTJ) stack formed on said first shield, the MTJ stack having a generally rectangular shape and two opposite side edges, said MTJ stack comprising:
an antiferromagnetic (AFM) layer;
a pinned layer of ferromagnetic material in contact with said AFM layer;
a free layer of ferromagnetic material; and
a tunnel junction layer of electrically insulating material disposed between said pinned layer and said free layer;
a second shield (S2) of ferromagnetic material formed on and in contact with said MTJ stack;
a first insulator layer formed on the first shield layer on opposite sides of said MTJ stack and in abutting contact to the side edges of said MTJ stack;
a hard bias layer of ferromagnetic material formed on the first insulator layer on opposite sides of said MTJ stack and in abutting contact to or overlapping said MTJ stack, said hard bias layer having a magnetic moment for biasing the magnetic moment of the free layer in substantially the same direction as the moment of the hard bias layer in the absence of an applied magnetic field; and
a second insulator layer formed on the hard bias layer and separating said hard bias layer from said second shield layer;
an actuator for moving said MTJ sensor across the magnetic recording disk so the MTJ sensor may access different regions of magnetically recorded data on the magnetic recording disk; and
a recording channel coupled electrically to the MTJ sensor for detecting changes in resistance of the MTJ sensor caused by rotation of the magnetization axis of the free ferromagnetic layer relative to the fixed magnetization of the pinned layer in response to magnetic fields from the magnetically recorded data.

12. The disk drive system as recited in claim 11, wherein the thickness of said first insulator layer is substantially equal to the thickness of said MTJ stack.

13. The disk drive system as recited in claim 11, wherein said first insulator layer is made of $Al_2O_3$.

14. The disk drive system as recited in claim 11, wherein said second insulator layer is made of $Al_2O_3$.

15. The disk drive system as recited in claim 11, further comprising:
a first electrical connection fixed on said first shield for making electrical contact from said first shield to a current source and to a signal detector; and
a second electrical connection fixed on said second shield for making electrical contact from said second shield to said current source and to said signal detector; said first and second shields providing electrical leads for sensing the electrical resistance to sense current flow perpendicularly through the MTJ stack and sense current flow is prevented by said first insulator layer from shunting around said MTJ stack.

16. The disk drive system as recited in claim 11, wherein said hard bias layer is made of Co—Pt—Cr.

17. The disk drive system as recited in claim 11, wherein said AFM layer is made of $Mn_{50}$—$Fe_{50}$.

18. The disk drive system as recited in claim 11, wherein said AFM layer is chosen from a group of materials including Mn—Fe, Ni—Mn, Pd—Mn, Pt—Mn, Pd—Pt—Mn, Ir—Mn, Rh—Mn, and Cr—Mn—Pt.

19. The disk drive system as recited in claim 11, wherein said first shield is made from Ni—Fe.

20. The disk drive system as recited in claim 11, wherein said second shield is made from Ni—Fe.

* * * * *